United States Patent [19]

Meagher et al.

[11] Patent Number: 4,462,462

[45] Date of Patent: Jul. 31, 1984

[54] THERMAL CONDUCTION PISTON FOR SEMICONDUCTOR PACKAGES

[75] Inventors: Ralph E. Meagher, Vicksburg, Mich.; Carl D. Ostergren, Montgomery, N.Y.

[73] Assignee: International Business Machines Corporation, Armonk, N.Y.

[21] Appl. No.: 322,322

[22] Filed: Nov. 17, 1981

[51] Int. Cl.³ .............................................. H01L 23/42
[52] U.S. Cl. ................... 165/80 C; 357/81; 361/386
[58] Field of Search .............. 165/80 B, 80 C, 185; 174/16 HS; 357/81, 82; 361/386

[56] References Cited

U.S. PATENT DOCUMENTS 3,993,123 11/1976 Chu et al. ........................... 165/80
4,193,445 3/1980 Chu et al. ...................... 165/80 C X
4,235,283 11/1980 Gupta ............................... 165/80 C

OTHER PUBLICATIONS

Bhattachasya and Sullivan, *IBM Technical Disclosure Bulletin*, vol. 21, No. 2, Jul. 1978, "Chip Cooling Package".

Hasson and Tomka, *IBM Technical Disclosure Bulletin*, vol. 23, No. 1, Jun. 1980, "Pistons for Cooling Circuit Chip".

Meeker, Scanlon and Segal, *IBM Technical Disclosure Bulletin*, vol. 20, No. 7, Dec. 1977, "Module Thermal Cap for Semiconductor Chip Package".

*Primary Examiner*—William R. Cline
*Assistant Examiner*—Edward P. Walker
*Attorney, Agent, or Firm*—Wolmar J. Stoffel

[57] ABSTRACT

An improved conduction cooling system for a semiconductor package that includes a slidable conduction cooling piston in contact with a device and mounted in a cap or cold plate, a means for urging the piston longitudinally and laterally into contact with the device and the cap or cold plate, respectively, and a means to prevent rotation of the piston.

14 Claims, 6 Drawing Figures

THERMAL CONDUCTION PISTON FOR SEMICONDUCTOR PACKAGES

DESCRIPTION

1. Technical Field

This invention relates to techniques and structures for the dissipation of thermal energy generated by semiconductor devices. More particularly, the present invention relates to a conduction system for cooling integrated circuit semiconductor devices mounted on a substrate with solder bonds, with a cold plate mounted over the devices.

High circuit densities in modern integrated circuit semiconductor devices require that the heat generated by their operation be efficiently and quickly removed in order to maintain the temperature of the devices within limits that will keep the operating parameters of the devices within pre-determined ranges, and also prevent destruction of the device by over-heating. The problems of heat removal are increased when the device is connected to the supporting substrate with solder terminals that electrically connect the device to the appropriate terminals on the substrate. In such solder bonded devices, the heat transfer that can be accomplished through the solder bond is limited, as compared to back-bonded devices. The major portion of the heat generated during operation must therefore be removed from the back side of the device.

The cooling or removal of heat from semiconductor devices can be accomplished by a number of well-known techniques. A common technique is to allow the air surrounding the device to remove the heat by conduction and convection. The heat removal can be increased by forcibly circulating air over and around the device. However, the amount of heat that can be removed by this technique is quite limited and, in general, insufficient for dense high performance semiconductor devices. Cooling of the devices can also be achieved by immersing the devices in a suitable liquid coolant. However, the liquid coolant can result in corrosion of the device and substrate metallurgy, and can also prevent re-work problems in the event that the package requires repair. Cooling can also be achieved by providing a conductive link of material between the back side of the device and the cover or cooling plate. However, this general technique has a number of problems associated with its use. If the material is a thick viscous fluid, as in thermal grease, the material can move, particularly upon heating of the device and seep down to the metallurgy of the device and substrates causing corrosion and possible shorting. If the material is rigidly held in place and the material itself is rigid, temperature changes of the material and the device can result in stresses being generated which can and often do fracture the device rendering it useless. Conducting links formed of a movable piece of material, such as a piston, are also known. However, the device is subject to breakage in the event that the package is subjected to shock or inertial forces. In addition, difficulty has been experienced in achieving area interfacial contact between the device and the piston. Minute variations in the length of the solder bonds joining the device to the substrate can result in tilted devices where the back surfaces of the devices do not contact the movable pistons over an area, but rather at a point or line contact. This increases the thermal resistance between the device and the pistons and reduces the capacity for dissipating the heat generated by the device.

2. Background Art

The following prior art references relate to various structures for removing heat from a solder bonded semiconductor device.

U.S. Pat. Nos. 3,741,292 and 3,851,221 both disclose semiconductor packages containing a low boiling point dielectric fluid surrounding a plurality of semiconductor devices.

U.S. Pat. No. 3,993,123 discloses a semiconductor package in which a movable heat conductive piston is placed in contact with the back side of a solder bonded semiconductor device to conduct heat away from the device to a cooling plate.

U.S. Pat. No. 4,235,283 discloses a segmented heat conductive piston for removing heat from the back side of a device. The segmented piston is adapted to contact the back side of the device at a plurality of points in the event that the device is tilted and thereby obtain a lower thermal resistance across the piston-device interface.

U.S. Pat. No. 4,156,458 discloses a package in which a bundle of metallic foils is used to conduct heat from the device to the heat sink.

U.S. Pat. No. 4,092,697 discloses a semiconductor package wherein a formable pillow filled with a thermal liquid material is exposed between the back side of a semconductor device and the cap and serves as a heat conductive bridge.

DISCLOSURE OF INVENTION

It is an object of this invention to provide a simple, inexpensive, and efficient conduction cooling structure for highly integrated semiconductor devices.

It is another object of this invention to provide a semiconductor package conduction cooling structure wherein an area surface interface contact can be established between the semiconductor device and the piston to reduce thereby the interface thermal resistance.

Another object of this invention is to provide a thermal conduction cooling system for a semiconductor package wherein the impact damage is minimized to the chip in the event that the package is subjected to severe shock and/or acceleration or deceleration forces.

Our improved conduction cooling system for a semiconductor package having a substrate, at least one semiconductor device mounted on the substrate with the backside surface facing upwardly away from the substrate, and a heat sink mounted above said substrate, wherein the improvement consists of a cooling piston slidably mounted on the heat sink in an opening with one end contacting the backside surface of the device, a means for urging said piston downwardly into contact with the device and laterally to provide a firm constant surface-to-surface contact between the piston and the heat sink, and a means to prevent rotation of the piston in the opening.

BRIEF DESCRIPTION OF THE DRAWINGS

The details of our invention will be described in connection with the accompanying drawings in which.

BEST MODE FOR CARRYING OUT THE INVENTION

Figure 1:
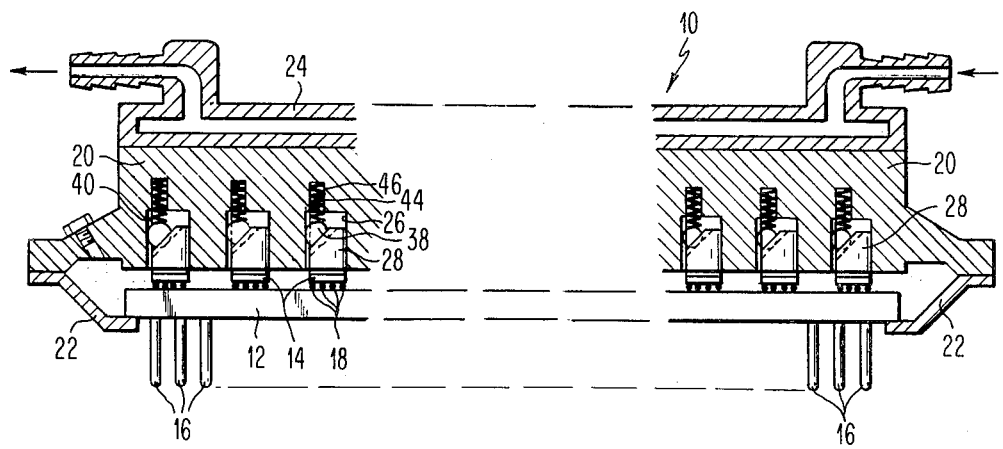
FIG. 1 is an elevational view in section illustrating the improved conduction cooling system of our invention applied to a multi-device water cooled semiconductor package.
Figure 2:
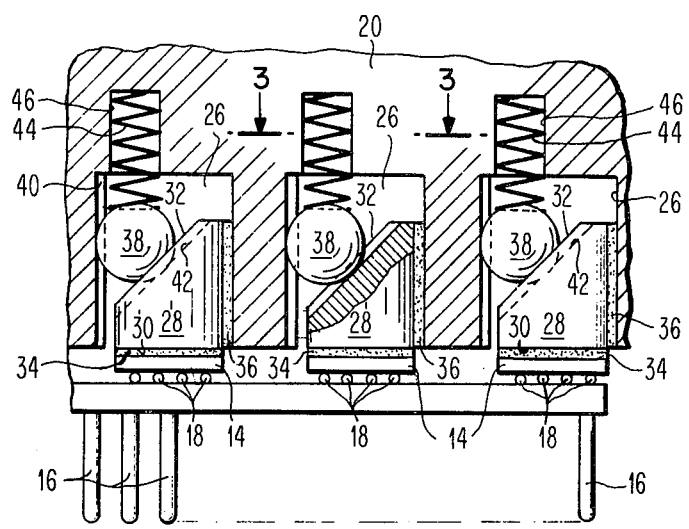
FIG. 2 is a sectional view in enlarged scale illustrating the embodiment depicted in FIG. 1.
Figure 3:
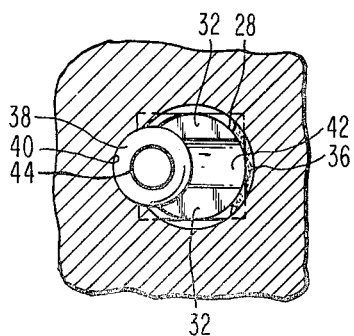
FIG. 3 is a top view in broken section taken on line 3—3 of FIG. 2.

Referring now to the drawings, in particular FIGS. 1, 2 and 3, there is depicted a first embodiment of the improved conduction cooling system of the invention applied to a multi-semiconductor chip package 10. The semiconductor package 10 has a substrate 12 formed of dielectric material and embodying a suitable metallurgy system to interconnect the devices 14 mounted on the top surface with each other and also connect them to I/O pins 16 on the bottom surface of the substrate. Any suitable interconnection system can be used in substrate 12. However, when the devices 14 are highly integrated and many devices are to be interconnected on a single substrate, a multi-layer ceramic substrate structure is preferred as disclosed and claimed in U.S. Pat. No. 4,245,273. Devices 14 are illustrated as electrically joined to the metallurgy of substrate 12 through solder bonds 18, described in U.S. Pat. Nos. 3,429,040 and 3,495,133. Cover 20, in combination with substrate 12 forms an enclosure over devices 14. The cover can be joined to the substrate 12 in any suitable manner as for example, it can be joined to flange 22 which is in turn joined to substrate 12, as for example, by brazing. A liquid cooled cold plate 24 is attached to cover 20 for more effectively removing heat from the package that is generated by devices 14 during their operation. It is understood that other suitable means can be used to remove heat from the cover, as for example, fins cooled by moving air, evaporative techniques, and the like.

Cover 20 contains cylindrically shaped openings 26 located over each of semiconductor devices 14. Slidably disposed in each opening 26 is a cylindrically shaped piston 28 having a bottom surface 30 in contact with a semiconductor device, and an inclined top surface 32. Preferably sufficient clearance will be provided between the diameter of the cylinders 26 and the diameter of pistons 28 to allow space for a layer of solder on the one-half of the piston wall next to the cylinder wall. In this case, the other half of the piston wall would not have solder. In any case, one-half of the piston wall will not be in contact with the cylinder wall. It is important to establish a good interface contact between the pistons 28 and the devices 14 in order to reduce the thermal resistance across the interface and thereby increase the efficiency of the heat removal system. Preferably a layer of low melting conductive material 34 is disposed between the end 30 of piston 28 and device 14 as indicated more clearly in FIG. 2. Typical heat conductive materials having a low melting point are metal alloys such as woods metal, and the like with a melting point in the range of 60° C. to 250° C. The pistons 28 are formed of a good heat conductive material, as for example, copper, that is solder wettable. In operation, the layer of heat conductive material 34 should adhere to the solder wettable piston and not to the back surface of devices 14. In operation, the layer 34 is caused to melt, thereby to form a conformal interface between the piston and the device 14. A similar layer 36 can be deposited on the sidewall of piston 28 which will improve the interface contact between the piston and the wall of opening 26. When the material of cover 20 is non-wettable to solder, the layer 36 will adhere only to the piston 28. The layer 36, upon heating, will conform to the inside of opening 26 in the same manner and preferably at the same time as layer 34. In order to prevent any overflow solder from forming a shoulder of solder at the bottom edge of the cylinder wall, it may be desirable to put a groove in the piston or alternatively it may be desirable to treat the surface of that area of the wall in such a way as to prevent solder from wetting it. In order to maintain the conformal interface between the sidewall of the piston and the end surface of the piston, the piston must be prevented from rotating. Rotation is prevented by the arrangement of a detent 38 that interacts with a longitudinally extending slot 40 in opening 26 and a recess 42 in the top surface of piston 28. Preferably detent 38 is a spherical ball biased downwardly by helical spring 44 seated in a bore 46 in cover 20. Preferably, as indicated in FIG. 3, the cross section curvature of longitudinal slot 40 corresponds to the curvature of spherical ball 38. Likewise, the recess 42 is a groove that extends all or part of the distance across the top surface 32 of the piston 28 and has a radius of curvature corresponding to the radius of curvature of the ball 38. This arrangement provides a means to prevent rotation of the piston 28, and also provides a means to bias the piston 28 downwardly in contact with the device 14, and laterally so that the sidewall of the piston contacts the sidewall of the opening 26. It is apparent that the shape of the detent and the grooves and the manner of biasing can be modified and yet achieve applicants' objectives. Further, layers 34 and 36 which improve the interface contact between the device and piston and the piston and sidewall can be deleted with some loss of heat conductance. As indicated in FIG. 3 the opening 26, the longitudinal slot 40, and the bore 46 can be machined conveniently in the cover 20 by selecting the proper circular boring tools.

Figure 4:
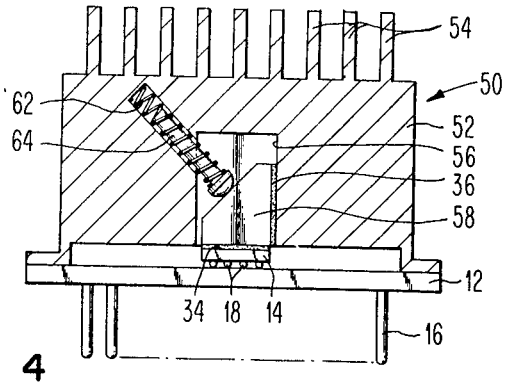
FIG. 4 is an elevational view in broken cross section of a semiconductor package in which there is embodied another embodiment of the improved cooling system of our invention.
Figure 5:
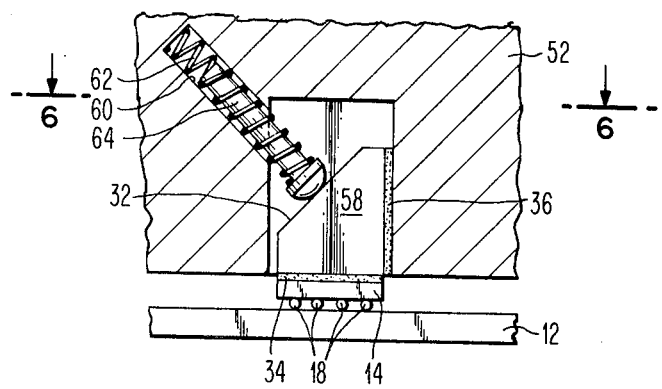
FIG. 5 is an elevational view in broken section in enlarged scale illustrating the embodiment depicted in FIG. 4.
Figure 6:
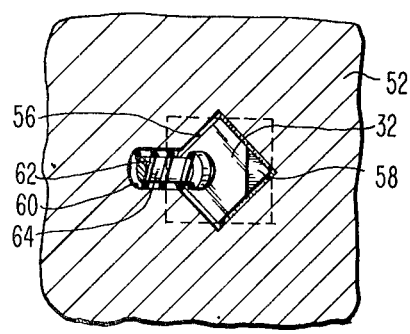
FIG. 6 is a top elevational view in broken section taken on line 6—6 of FIG. 5.

Referring now to FIGS. 4, 5 and 6 of the drawings there is depicted another preferred specific embodiment of the conduction cooling system of our invention. Semiconductor package 50 has a dielectric substrate 12 provided with an interconnection metallurgy system and I/O pins 16 similar to the substrate described in the aforedescribed embodiment. One or more semiconductor devices 14 are interconnected to the metallurgy system of the substrate by solder bonds 18. A cover 52, with substrate 12, forms an enclosure for the device 14 mounted on the substrate 12. Cover 52 is provided with fins 54 for dissipating the heat generated by device 14. It is apparent that this embodiment can also be used for a multi-chip semiconductor package of the type described in connection with FIGS. 1 through 3. Cover 52 has an opening 56 overlying device 14 with piston 58 slidably mounted therein. Piston 58 preferably is provided with a layer 34 on the bottom surface, and a layer 36 on the side surface formed of a low melting heat conductive material. Layers 34 and 36 serve the same purpose as in the previous embodiment. Also the clearance between the piston 58 and the opening 56 is sufficient to allow limited tilting of the piston 58 in order to accommodate for tilted devices 14 which may be due to different heights of solder bonds 18. In order to prevent rotation of the piston 58 in opening 56, the opening in the piston is provided with a non-circular cross sectional shape. A preferred piston has a square cross-sectional configuration as illustrated in FIG. 6. The cross-sectional configuration of the piston and the aperture 56 can be any other suitable non-circular configuration to prevent rotation. A mechanism is provided to bias the piston downwardly and axially as in the first embodiment. Piston 58 is provided with an inclined surface 32 on the top end. A cylindrical bore 60 is provided in cap 52 and set at an angle approximately transverse to surface 32. Within bore 60 there is seated a helical spring 62 that biases a headed pin 64 into engagement with surface 32 on piston 58. This arrangement maintains the piston 58 into contact with the device 14 and also against the side of aperture 56.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

We claim:

1. A semiconductor package having a substrate for supporting at least one semiconductor device mounted on said substrate, a means to join and electrically connect at least one said device to metallurgy on said substrate, a cover on said substrate overlying said semiconductor device, the improvement comprising at least one piston slidably mounted in an opening in said cover, said piston having a top surface which is inclined relative to the longitudinal axis of said piston, a single biasing means in engagement with said top inclined surface, said biasing means urging said piston both longitudinally into contact with the back side of at least one said device, and also laterally into contact with a wall of said opening, and a means to prevent rotation of said piston in said opening.

2. The semiconductor package of claim 1 which further includes a first layer of low melting metal alloy between the end of said piston and the back side of said at least one semiconductor device, said first layer providing a conformal interface between said piston and said device.

3. The semiconductor package of claim 2 which further includes a second layer of a low melting metal alloy between said piston and the wall of said opening in which said piston is mounted.

4. The semiconductor package of claim 3 wherein said piston is made of a solder wettable material and said wall of said opening is of a material that is not wettable to solder.

5. The semiconductor package of claim 4 wherein said piston is made of Cu and the wall of said opening is formed of Al.

6. The semiconductor package of claim 1 wherein said piston is cylindrical in shape.

7. The semiconductor package of claim 6 wherein said means to prevent rotation of the piston is comprised of a recess in said inclined top surface, and a longitudinal slot in said opening, a detent element seated in said recess and said longitudinal slot.

8. The semiconductor package of claim 7 wherein said single biasing means to urge said piston in longitudinal and lateral directions is comprised of a spring means urging said detent element in a longitudinal direction.

9. The semiconductor package of claim 7 wherein said recess in said inclined surface is a groove having an arcuate cross section, said longitudinal slot in said opening is arcuate in cross section, and said detent element is a sphere.

10. The semiconductor package of claim 8 wherein said spring means is a helical spring located in said opening in said cover above said piston in engagement with said detent element, said spring urging said detent element in a longitudinal direction, said detent seated in said recess in said inclined surface of said piston thereby importing a laterally directed component force to said piston.

11. The semiconductor package of claim 1 wherein said means to prevent a rotation is comprised of said piston having a square shaped cross sectional configuration and said opening in said cover having a corresponding square shaped cross sectional configuration.

12. The semiconductor package of claim 11 wherein said single biasing means to urge said piston in longitudinal and lateral directions is comprised of; a spring means in engagement with said inclined surface, the longitudinal axis of said biasing means intersecting the longitudinal axis of said piston, whereby the longitudinal axis of said biasing means, and the longitudinal axis of said piston are not parallel, said biasing means imparting a force that is broken into longitudinal and lateral components.

13. The semiconductor package of claim 1 wherein sufficient clearance is provided between said piston and said opening to permit tilting of said piston relative to the longitudinal axis of said opening.

14. The semiconductor package of claim 13 wherein a layer of low melting alloy is deposited on the side wall of said piston.

* * * * *